United States Patent [19]

Thesling

[11] Patent Number: 5,930,272
[45] Date of Patent: Jul. 27, 1999

[54] BLOCK DECODING WITH SOFT OUTPUT INFORMATION

[75] Inventor: William H. Thesling, Brunswick, Ohio

[73] Assignee: Efficient Channel Coding, Inc., Eastlake, Ohio

[21] Appl. No.: 08/872,365

[22] Filed: Jun. 10, 1997

[51] Int. Cl.$^6$ .................................................. H03M 13/00
[52] U.S. Cl. .................................. 371/37.01; 371/37.03; 371/37.06; 371/37.09; 371/43.6; 375/262; 375/341
[58] Field of Search ................................ 371/37.01, 37.03, 371/37.06, 37.07, 37.08, 37.09, 37.11, 37.12, 37.7, 43.1, 43.3, 43.4, 43.6, 43.7; 375/262, 263, 265, 341

[56] References Cited

U.S. PATENT DOCUMENTS

| | | | |
|---|---|---|---|
| 4,322,848 | 3/1982 | Snyder, Jr. | 371/37.9 |
| 4,763,331 | 8/1988 | Matsumoto | 371/37.8 |
| 4,882,733 | 11/1989 | Tanner | 371/37.01 |
| 5,157,671 | 10/1992 | Karplus | 371/37.01 |
| 5,208,816 | 5/1993 | Seshardi et al. | 371/43.7 |
| 5,319,649 | 6/1994 | Raghavan et al. | 371/37.06 |
| 5,537,444 | 7/1996 | Nill et al. | 375/341 |

OTHER PUBLICATIONS

Thesis of William H. Thesling entitled "Efficient Block Decoding Algorithms Exploiting Channel Measurement Information," Cleveland State University, Dec. 1995.

David F. Freeman et al. "A Two–Dimensional Product Code with Robust Soft–Decision Decoding," IEEE Transactions On Communications, vol. 44, No. 10, Oct. 1996, pp. 1222–1226.

*Primary Examiner*—Emmanuel L. Moise
*Attorney, Agent, or Firm*—Calfee, Halter & Griswold LLP

[57] ABSTRACT

A method for decoding a linear block code of information bits transmitted across a signal channel, comprising the steps of:

a) receiving the transmitted signals from the channel and converting the received signals into a number of received vectors r with each received vector having a length of n; and for each vector r, b) performing hard decisions on r to produce a hard decision data vector b and a corresponding reliability information vector a and performing hard decision decoding on b to produce an error pattern e, and further converting each vector b into a center code word; the vector a and the center code word each having a length n;

c) identifying a set of j=0 to p nearby code words including the center code word;

d) determining, for each nearby code word a difference metric $DM_j$, wherein each difference metric $DM_j$ is defined by the following relationship:

$$DM_j = \Sigma \delta_j(I)\alpha(I) \text{ for } I=0 \text{ to } n$$

where $\delta_j \epsilon (0, 1)$ is the Hamming difference between b and the $j^{th}$ nearby code word;

e) identifying a minimum difference metric $D_{min}$, and determining an output code word as being that code word which corresponds to $D_{min}$; and f) assigning a confidence measure for each bit m in the output code word based on a difference of difference metric values for the dominant code word with a "1" in the $m^{th}$ position and the dominant code word with a "0" in the $m^{th}$ position.

20 Claims, 3 Drawing Sheets

BLOCK DECODING WITH SOFT OUTPUT INFORMATION

BACKGROUND OF THE INVENTION

The invention relates generally to decoding linear block codes. More particularly, the invention relates to linear block code decoding techniques that utilize soft input and produce soft output information.

Many techniques have been developed for increasing the reliability of digital information that has been sent across a transmission channel to a receiver. One of these techniques is to encode the data bits into a number of messages in block format prior to transmission. At the receiver, a decoder is used to estimate the original message based on the received data. Some decoding rules utilize all the information in the received data bit stream and such decoding processes are generally referred to as soft decision decoding. Soft decision data includes information that indicates what value each received bit is assigned (e.g. a "1" or a "0") and an associated value that indicates the reliability or confidence that the value assigned to a particular received bit is correct. This is generally referred to herein as "soft input" information to a decoder. A decoder then utilizes the soft input information to decode the received information so as to produce an estimate of the original transmitted data.

The value of any coding technique increases if the decoder output includes not only an accurate estimate of the original message but also reliability information or a confidence measure as to the likelihood that the decoded message is correct. This is generally referred to herein as "soft output" information. Soft output information as to the reliability associated with each decoded bit can be useful, for example, with iterative decoding techniques.

Known decoding processes tend to be very computationally intensive operations. It is desirable to develop decoding techniques that substantially reduce the number of steps involved in the decoding process without a significant loss in accuracy. Known sub-optimal decoding techniques, however, do not include soft output information.

The objectives exist, therefore, for providing a simplified decoding process that also produces soft output information.

SUMMARY OF THE INVENTION

The present invention contemplates, in one embodiment, a method for decoding a linear block code to produce soft output information, comprising the steps of:

a) receiving the transmitted signals from the channel and converting the received signals into a number of received vectors r with each received vector having a length of n; and for each vector r, b) performing hard decisions on r to produce a hard decision data vector b and a corresponding reliability information vector $\alpha$ and performing hard decision decoding on b to produce an error pattern e, and further converting each vector b into a center code word; the vector $\alpha$ and the center code word each having a length n;

c) identifying a set of j=0 to p nearby code words including the center code word;

d) determining, for each nearby code word a difference metric $DM_j$, wherein each difference metric $DM_j$ is defined by the following relationship:

$$DM_j = \Sigma \delta(I)\alpha(I) \text{ for } I=0 \text{ to } n$$

where $\delta_j \epsilon(0, 1)$ is the Hamming difference between b and the $j^{th}$ nearby code word;

e) identifying a minimum difference metric $DM_{min}$ and determining an output code word as being that code word which corresponds to $DM_{min}$; and f) assigning a confidence measure for each bit m in the output code word based on a difference of difference metric values for the dominant code word with a "1" in the $m^{th}$ position and the dominant code word with a "0" in the $m^{th}$ position.

These and other aspects and advantages of the present invention will be readily understood and appreciated by those skilled in the art from the following detailed description of the preferred embodiments with the best mode contemplated for practicing the invention in view of the accompanying drawings.

DETAILED DESCRIPTION OF THE INVENTION

Figure 1:
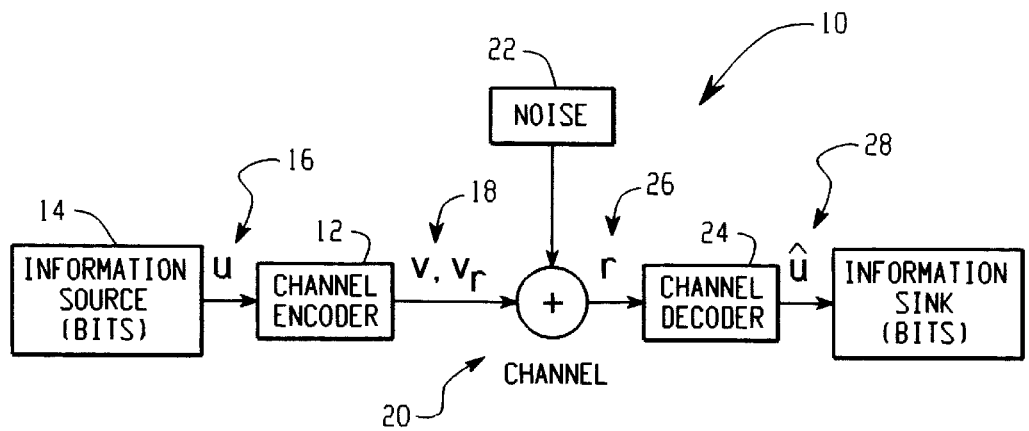
FIG. 1 is a simplified model of a coded communication channel.

With reference to FIG. 1, a simplified coded communication model 10 is shown in FIG. 1. Two different types of codes are in common use today, block codes and convolutional codes. The present invention is directed to block codes. An encoder 12 for a block code divides the information into message blocks of k information bits. A message block 14 is represented by $u=(u_1, u_2, \ldots, u_k)=(u(1), u(2), \ldots, u(k))$, and is called a message 16. The encoder 12 transforms each message u into an n-tuple vector $v=(v_1, v_2, \ldots, v_n)=(v(1), v(2), \ldots, v(n))$ called a code word 18. Since there are $2^k$ possible messages, there are $2^k$ possible code words at the encoder output. The set of $2^k$ code words of length n is called an (n, k) block code. For a code to be useful, the code words must be distinct. Therefore, there is a one to one correspondence between code words v and messages u.

The vector v is a binary vector composed of 1s and 0s. It is convenient to define a mapping from the vector $v \epsilon(0, 1)$ to a new vector $v_r \epsilon(-1, +1)$. This mapping is defined as the replacement of the binary 0s and 1s with −1s and +1s respectively. It is the vector $v_r$ which is transmitted across a channel 20. The transmission channel 20 adds noise 22 to the transmitted vector $v_r$. Consequently, the vector received at a decoder 24 is the transmitted vector plus a noise vector. Let $r=(r_1, r_2 \ldots r_n)=(r(1), r(2), \ldots, r(n))$ be the vector 26 received at the decoder 24. The received vector r is a vector of length n whose elements are real numbers.

r(i)=+1+noise, when v(i)=1
r(i)=−1+noise, when v(i)=0.

For example, r(i) may be measured in terms of volts (e.g. +1 VDC and −1 VDC).

The decoding task is to estimate the message u from the received vector r. This estimated message 28 is denoted û.

Equivalently, because there is a one to one correspondence between code words v and messages u, the decoder can also estimate v (or $v_r$) This estimated code word is denoted $\hat{v}$.

A decoding rule is a strategy for generating the estimate $\hat{v}$ from r. This requires information about the noise statistics. It is assumed for purposes of this exemplary disclosure that the channel noise is Additive White Gaussian Noise (AWGN). Therefore, to each transmitted datum is added a gaussian random variable which is independent of the value added to other symbols.

One type of decoding rule is hard decision decoding. This type of decoding generates a binary vector $b=(b_1, b_2 \ldots b_n)=(b(1), b(2), \ldots, b(n))\epsilon(0, 1)$. The elements of b come from the sign of the elements of r.

$$b(i) = \begin{cases} 1 & \text{if } r(i) \geq 0 \\ 0 & \text{otherwise} \end{cases}$$

b is called the hard decision vector of r. Hard decision decoding rules use the vector b to generate a code word which is the estimate of $\hat{v}$.

Other decoding rules use soft decision decoding. Soft decision decoding rules utilize all the information in r throughout the decoding process. The vector b is not necessarily generated. It is only after the decoder has completed the decoding process that a vector of 1s and 0s is produced. This vector is the estimate $\hat{v}$.

For ease of explanation, the exemplary embodiment herein is directed to a subclass of block codes called linear block codes. A block code is linear if and only if the modulo-2 sum (exclusive-OR or XOR) of any two code words is also a code word. For an (n, k) linear block code there exists a kxn matrix G such that $$v=uG,$$

wherein addition is modulo-2, and the elements of G are (0, 1). G is called the generator matrix of the code.

In a well constructed code, distinct words are different in as many positions as possible. The minimum number of positions in which any two code words differ is called the minimum distance of the code and is denoted $d_{min}$. Since the difference (which is also the modulo-2 sum) of any two code words is another code word, the minimum distance of the code is also the minimum number of 1s in a code word (excluding the all zeros code word). The number of 1s in a vector is called the Hamming weight of the vector. Therefore, $d_{min}$ is often referred to as the minimum Hamming weight of the code or the minimum Hamming distance of the code. The minimum Hamming distance of a code ultimately dictates the code's performance.

For a linear code defined by G, there exists an n-k x n matrix $H(h_{ij}\epsilon(0, 1))$ such that $$GH^T=0.$$

H is called the parity check matrix of the code. A vector $s\epsilon(0, 1)$ is a vector of length n-k and is given by, $$s=bH^T.$$

s is called the syndrome of b.

Define a vector $e=(e_1, e_2 \ldots e_n)=(e(1), e(2), \ldots, e(n)) \epsilon (0, 1)$. e is called an error pattern. One can then define e=v+b. Given an estimate of e, one could estimate v from b as follows:

$$\hat{v}=\hat{e}+b$$

A property of the syndrome is that if b is a code word, then s=0. Consequently, $$s=bH^T=(v+e)H^T=vH^T+eH^T=0+eH^T=eH^T.$$

Therefore, the syndrome is conveying information about the error pattern e and is independent of the transmitted code word v. There are $2^n$ possible error patterns and only $2^{n-k}$ syndromes. Therefore, there are $_2k$ error patterns per syndrome. However, there is at most one error pattern with a Hamming weight $st=[[d_{min}-1]/2]$ per syndrome, where t is called the error correcting capability of the code.

A common hard decision decoding algorithm is:
1. Compute s from b.
2. Find the error pattern $\hat{e}$ with Hamming weight <t for the syndrome s.
3. Compute $\hat{v}=\hat{e}+b$.

When the true error pattern e has Hamming weight >t, there may be no error pattern with Hamming weight $\leq t$ for the computed syndrome. There are many ways to handle this condition. For present purposes, simply choose any one of the possible error patterns with minimum Hamming weight (there may be several) for $\hat{3}$.

Maximum likelihood decoding (MLD) is a soft decision decoding rule which seeks to minimize the probability of word error. MLD minimizes $$\Pr\{(\hat{v} \neq v)|r\}.$$

It can be shown that for the AWGN channel, MLD can be accomplished by choosing for the estimate of v, the code word which is closest to r. Closest is with respect to Euclidean distance. Define $c_j(i)\epsilon(-1, +1)$ as the ith element of the jth code word ($1 \leq j \leq 2^k$) in accordance with the mapping $(0, 1 \rightarrow (-1, +1)$ respectively. MLD is accomplished by finding the code word j that minimizes $$dist_j^2 = \sum_{i=1}^{n} (c_j(i) - r(i))^2 \qquad (1)$$

or, $$dist_j^2 = \sum_{i=1}^{n} c_j^2(i) - 2\sum_{i=1}^{n} c_j(i)r(i) + \sum_{i=1}^{n} r^2(i).$$

The first term in (1) is a constant (=n) since all components of all code words are either −1, or +1. The last term is constant for all j and is a measure of the energy in the received vector. Therefore, to find the code word which is closest to the received vector r, one needs to find the code word $c_j$ which will maximize the correlation $cc_j$, where $cc_j$ is defined by $$cc_j = \sum_{i=1}^{n} c_j(i)r(i). \qquad (2)$$

One MLD algorithm is to correlate the received vector r with each of the j possible transmitted sequences or code words (where $1 \leq j \leq 2^k$), and choose the one with the highest correlation. This is called correlation decoding. This "direct" approach is acceptable for small codes or low rate codes where the number of code words is small (k<10). However, this technique quickly becomes intractable for codes with large k. For example, consider the (24, 12) extended Golay code. Correlation decoding via this direct approach requires approximately 98,300 addition-equivalent operations to decode 12 information bits.

An alternative technique that utilizes some of the principals of correlation decoding, but with significantly less complexity and minimal loss in performance, is Pseudo-Maximum Likelihood (PML) decoding. This technique is described in "EFFICIENT BLOCK DECODING ALGORITHMS EXPLOITING CHANNEL MEASUREMENT INFORMATION" by William H. Thesling, Thesis for Doctor of Engineering in Electrical Engineering, Cleveland State University, Cleveland, Ohio (1995), the entire disclosure of which is fully incorporated herein by reference. The thesis is available from the Cleveland State University Library, 1860 East 22nd Street, Cleveland, Ohio. Pertinent portions thereof are included in this specification.

The basic technique is called Pseudo-Maximum Likelihood (PML) since it is based on correction decoding which is considered to be the maximum likelihood decoding algorithm. Compared to correlation decoding, the complexity of PML is greatly reduced. The performance of this algorithm can be made to be extremely close to maximum likelihood even for high Bit Error Rates (BERs) (e.g. $10^{-3}$) and asymptotically approaches that of maximum likelihood decoding with increasing signal to noise ratio (SNR).

Recall that for maximum likelihood decoding one can compute the correlation $cc_j$ for each code word $c_j$, $$cc_j = \sum_{i=1}^{n} c_j(i)r(i)$$

and choose the code word $c_j$ which has maximum correlation $cc_j$. Considering the (23, 12) Golay code, there are 23 multiplications and 22 additions for each correlation value. Since the code words are made up of +1 or −1, one can avoid the multiplications and simply do additions and subtractions. For all 4096 code words, this implies 4096×22 additions/subtractions. This yields 90,112 additions/subtractions. Notice that this ignores the "control overhead." That is, before doing an addition or subtraction, one still has to decide which to do. If this algorithm is implemented in dedicated hardware, (one circuit per code word) or dedicated software code, one can indeed ignore this. One still needs to search through the list of 4096 correlation values $cc_j$, and find the largest. Each step through the list requires a "greater than" decision which is a subtraction and a conditional branch on a negative result. This approximately brings the total up to 94,208 operations per 12 bits of uncoded data (98,304 for the (24, 12) extended Golay code).

The PML algorithm example herein is developed on the (23, 12, 7) Golay code as well as the (24, 12, 8) extended Golay code, but the ideas can be applied to any bit error correcting linear block code. The algorithm begins with the hard decision vector b, and the vector of reliability information α. First the vector b is decoded via a hard decision decoder. The PML algorithm requires that this first stage forces a decoding to a nearby (in Hamming distance) code word. Refer to this initial decoding device as decoder 1, and the code word which is the output of decoder 1 as the center code word.

Consider the (23, 12) Golay code. Provided that the received vector b has less than 4 errors, the center code word will be the correct code word (the code word which was transmitted). If b has 4 or more errors, than the center code word is not the transmitted code word.

Owing to the linear property of the code, a vector XOR between any two code words will yield another code word. The weight distribution polynomial for this code is as follows.

$$A(z)=1+253z^7+506z^8+1288z^{11}+1288z^{12}+506z^{15}+253z^{16}+z^{23}$$

Figure 2:
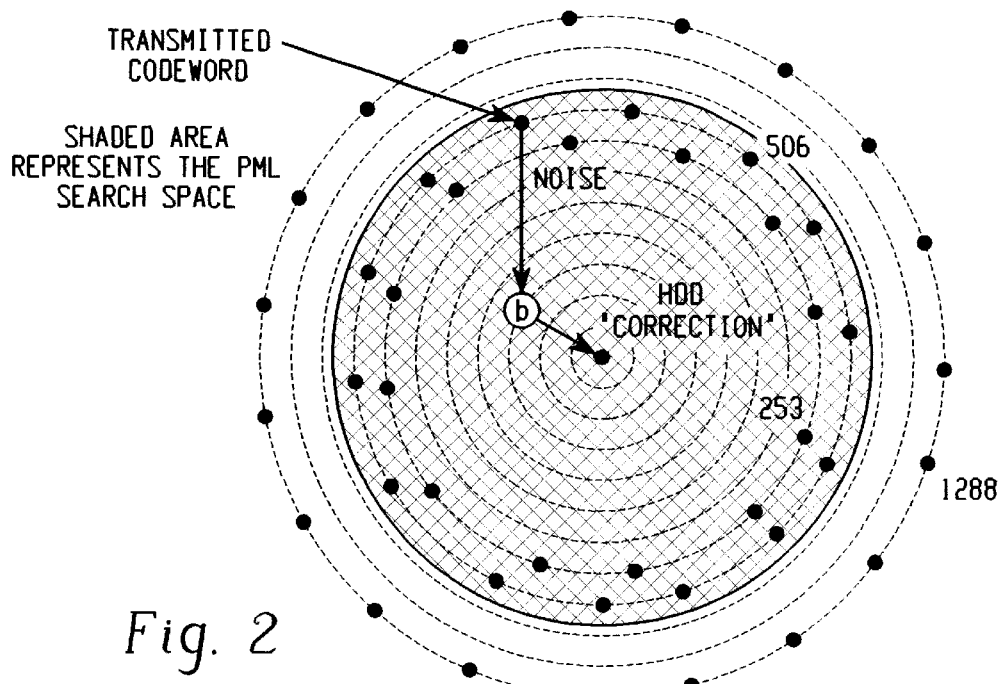
FIG. 2 illustrates in a graphical manner nearby codeword distribution and a typical decoder error event.

Notice that there are 253 code words of Hamming weight 7, and 506 code words of Hamming weight 8. There are no code words of weight 9 or 10. The PML algorithm searches through only the "close" code words. That is, those code words which are close to the center code word (received vector after hard decision decoding). For the (23, 12) Golay code, the preferred choice is to consider only those code words which differ from the center code word by code words of Hamming weight 7 or 8. Define these code words as nearby code words. This is depicted in FIG. 2.

Since this is a linear code, the code word distribution is also the code word difference distribution. Here the transmitted code word is received with noise resulting in the hard decision vector b which has 5 hard decision errors. Decoder 1 makes a "correction" resulting in the center code word. The PML algorithm will search through the set of nearby code words deciding on the "best" code word from this set (shaded region). (It should be noted that FIG. 2 is a two dimensional illustration of a 24 dimensional entity. It is meant for illustrative purposes only. Also, the diagram stops at the 11th circle, it actually contains 24 circles).

One approach to accomplish this might be to vector XOR all 759 code words of weight 7 or 8 with the center code word, to generate the nearby code words, and then use correlation to decide among this reduced set. This correlation operation would require that each code word be made up of elements from (−1,+1), and the received vector r. Correlation at this point would require 22 additions/subtractions per code word. This requires 759×22=16,698 additions and a search through the list of 760. This brings the total number of operations down to 17,458. This can be improved on by concentrating on the "difference in correlation values" as opposed to the correlation values themselves. This "difference" is the difference between correlation values of the nearby code words and the center code word.

Consider a received binary vector b and a vector of reliability information α. The maximum possible correlation value is obtained by adding up all the reliability values. This is the correlation value of the vector b and the received vector r. This is also the case when there are no errors in b, or b is a code word.

$$CC_{max} = \sum_{i=1}^{n} \alpha(i)$$

This is an upper bound on the correlation values. Any code word which is different from b results in a correlation value given by $$cc_j = CC_{max} - 2\sum_{i=1}^{n} \delta_{c_j}(i)\alpha(i)$$

where $\delta_{c_j}(i) \in (0, 1)$ is the "Hamming difference" between b, and the $j^{th}$ code word. That is, it is the code word XOR the received hard decision vector. With this, rather than finding the maximum correlation, only the minimum "difference" needs to be found, where the difference is given by $$diff_j = \sum_{i=1}^{n} \delta_c(i)\alpha(i)$$

for the center code word, the difference is give by $$diff_{CenterC} = \sum_{i=1}^{n} e(i)\alpha(i)$$

where $e(i) \in (0, 1)$ is the error pattern found by decoder 1. The difference for each of the nearby code words is given by $$diff_{nearbyC} = diff_{CenterC} + \sum_{i=1}^{n} C_{W7or8}(i)\alpha(i) - 2\sum_{i=1}^{n} C_{W7or8}(i)e(i)\alpha(i) \quad (3)$$

where, $C_{W7or8j}(i) \in (0, 1)$ is the ith element of the jth code word of Hamming weight 7 or 8. There are 759 such code words ($1 \leq j \leq 759$), and they will need to be individually stored, or at least pointers to their non-zero positions need to be stored. The first two terms in equation (3) correspond to the positions where each nearby code word differs from b neglecting any overlap between the two terms. The final term removes any overlap. Again, these values need only be computed for the 759 nearby code words. This can be simplified somewhat by altering the reliability vector α. The positions of the reliability vector where decoder 1 identified a bit in error, are replaced with their negative values. This yields a slightly altered new reliability vector $\alpha_e$. Equation (3) becomes, $$diff_{nearbyC} = diff_{CenterC} + \sum_{i=1}^{n} C_{W7or8}(i)\alpha_e(i) \quad (4)$$

The differences (Eq. 4) of the 760 code words (759 nearby code words, and the 1 center code word) which need to be searched to find the minimum difference are computed. Notice that the 759 vector XOR's are not performed. The approach is to find the minimum difference first, then perform a single vector XOR to obtain the best code word. This vector XOR will be between the center code word, and that weight 7 or 8 code word which gave rise to the minimum difference.

Notice that the "choose minimum difference" operation is really not concerned with what the difference is, only in finding the code word with the minimum difference. Every difference (per nearby code word) has the difference of the center code word "added" onto a summation which consists of only 7 or 8 terms. Therefore, define a difference metric (DM) which is related to this difference as follows, $$DM_j = \sum_{i=1}^{n} C_{W7or8j}(i)\alpha_e(i) \quad (5)$$

where j runs from 1 through the total number "p" of nearby code words (in this example, 759). The difference metric of the center code word (j=0) is taken to be zero. If this is performed in hardware, or if each difference metric calculation is explicitly written in a computer program, then there are 253×6+506×7 additions to perform (strictly additions, no subtractions), and a search through the 759 results. This is a total of 5060+759=5819 operations, which is an improvement over direct correlation decoding by a factor of 16.1 (ignoring decoder 1 and the final vector XOR operation).

The PML algorithm can be summarized as follows:

1. Perform hard decision decoding (HDD) on the received hard decision vector b with a hard decision decoder which decodes to a code word (decoder 1).

2. In the reliability vector α, complement the sign of the values at the locations where decoder 1 complements bits in the decoding process. Define this new reliability vector as $\alpha_e$.

3. Compute the difference metrics for all nearby code words which are expressed as a sum of operands from the set $\alpha_e(i)$.

4. Find the minimum difference metric, and note the corresponding code word. (This code word will be of weight 7 or 8 for the Golay code.)

5. Perform a vector XOR between the center code word, and the code word from part 4. This becomes the output code word.

The following is an example of the Pseudo Maximum Likelihood algorithm performed on the (23, 13) Golay code.

Consider the Golay code and assume the all zeros code word is the transmitted code word.

Let $\alpha =$

| $\alpha_1$ | $\alpha_2$ | $\alpha_3$ | $\alpha_4$ | $\alpha_5$ | $\alpha_6$ | $\alpha_7$ | $\alpha_8$ | $\alpha_9$ | $\alpha_{10}$ | $\alpha_{11}$ | $\alpha_{12}$ | $\alpha_{13}$ | $\alpha_{14}$ | $\alpha_{15}$ | $\alpha_{16}$ | $\alpha_{17}$ | $\alpha_{18}$ | $\alpha_{19}$ | $\alpha_{20}$ | $\alpha_{21}$ | $\alpha_{22}$ | $\alpha_{23}$ |
|---|---|---|---|---|---|---|---|---|---|---|---|---|---|---|---|---|---|---|---|---|---|---|

Let $b =$

| 0 | 0 | 0 | 0 | 0 | 0 | 1 | 1 | 0 | 0 | 1 | 0 | 0 | 0 | 0 | 0 | 0 | 1 | 0 | 0 | 0 | 0 |
|---|---|---|---|---|---|---|---|---|---|---|---|---|---|---|---|---|---|---|---|---|---|

Therefore, the received hard decision vector b has 4 errors at locations 7, 8, 12 and 19.
Let the associated syndrome and error pattern of b yield

EP =

| 0 | 0 | 0 | 1 | 0 | 0 | 0 | 0 | 1 | 0 | 0 | 0 | 0 | 0 | 0 | 0 | 1 | 0 | 0 | 0 | 0 | 0 | 0 |
|---|---|---|---|---|---|---|---|---|---|---|---|---|---|---|---|---|---|---|---|---|---|---|

Decoder 1 alleges errors at locations 4, 9 and 17. The center code word and $\alpha_e$ are given by:

Center Code word =

| 0 | 0 | 0 | 1 | 0 | 0 | 1 | 1 | 1 | 0 | 0 | 1 | 0 | 0 | 0 | 0 | 1 | 0 | 1 | 0 | 0 | 0 | 0 |
|---|---|---|---|---|---|---|---|---|---|---|---|---|---|---|---|---|---|---|---|---|---|---|

$\alpha_e =$

| $\alpha_1$ | $\alpha_2$ | $\alpha_3$ | $-\alpha_4$ | $\alpha_5$ | $\alpha_6$ | $\alpha_7$ | $\alpha_8$ | $-\alpha_9$ | $\alpha_{10}$ | $\alpha_{11}$ | $\alpha_{12}$ | $\alpha_{13}$ | $\alpha_{14}$ | $\alpha_{15}$ | $\alpha_{16}$ | $-\alpha_{17}$ | $\alpha_{18}$ | $\alpha_{19}$ | $\alpha_{20}$ | $\alpha_{21}$ | $\alpha_{22}$ | $\alpha_{23}$ |
|---|---|---|---|---|---|---|---|---|---|---|---|---|---|---|---|---|---|---|---|---|---|---|

PML calculates the 760 difference metrics (DM) for all code words of Hamming weight 7 or 8.

In this example the minimum DM should correspond to the center code word itself.

This code word XOR the center code word yields the all zeros code word (which is the transmitted code word in this example).

Figure 3:
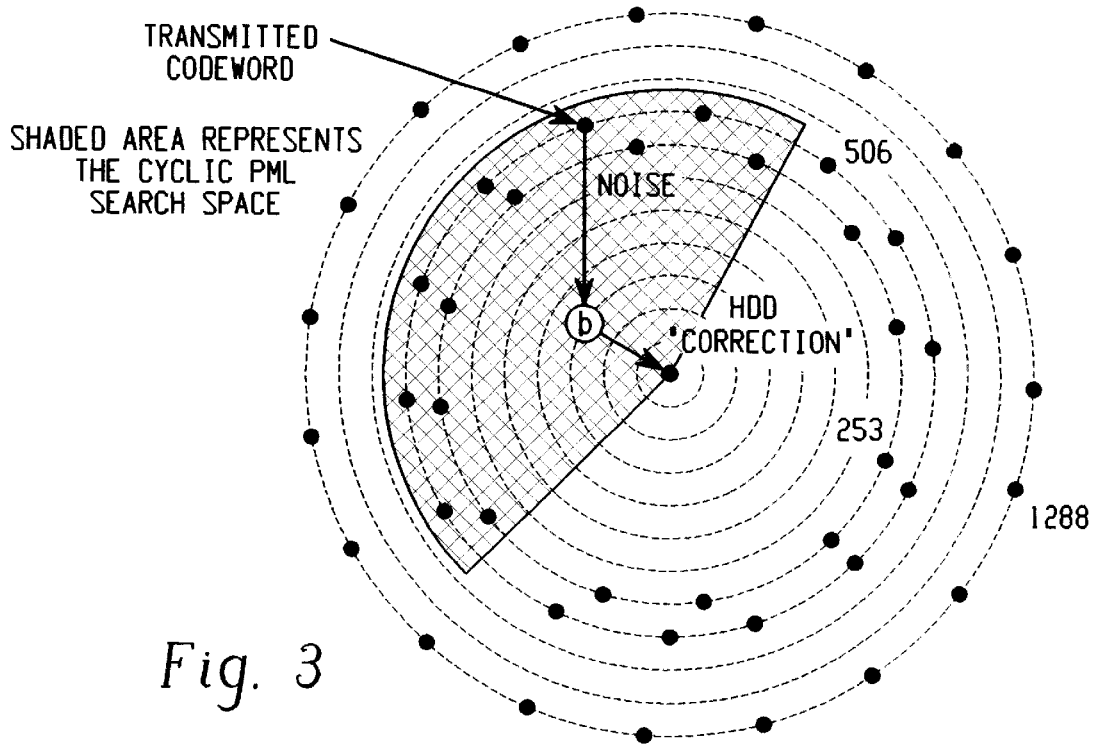
FIG. 3 illustrates in a graphical manner nearby codeword distribution and search space reduction using one position search, in this example, with a cyclic code.

For a cyclic code, the cyclic property of the code can be exploited to further simplify the PML algorithm with a very small degradation in performance (with respect to PML). A cyclic code has the property that any code word can be cyclically shifted 1 position and the resulting vector is a code word. Cyclic PML is PML with a condition on the search space to reduce its size. This is depicted in FIG. 3.

Notice that the search space is reduced by eliminating those code words which are "further" away from the received hard decision vector b. To accomplish this, the condition on the search space is to consider only those nearby code words which differ from the center code in the position of the lowest value of $\alpha_e(i)$. That is, use only those nearby code words which will "return to its received value" the one position most likely to have been correct, which decoder 1 alleged in error. The reason for this is that since the center code word will always be considered in the search space, the search space is populated with code words which assume the first decoder's correction was wrong. This can be performed by a separate subroutine that stores the subset of nearby code words (from the set of nearby code words) based on the location of the minimum values in $\alpha_e$.

Consider again the difference metric calculation of the Golay code which is a cyclic code (Eq. 3). Since there are only 7 or 8 non-zero elements in $C_{W7or8j}(i)$ and thus in the difference metric, each difference metric is computed via the addition of 7 (or 8) operands from the set of 23 $\alpha_e(i)$'s. All of the $\alpha_e(i)$'s are positive except those which are in the positions alleged to be in error by decoder 1. Those values will be negative (or zero). Once all the difference metrics are computed, a search is performed to find the minimum. The difference metric of the center code word is defined to be zero. The only way a difference metric from a nearby code word can be a minimum, is for it to be negative. A difference metric cannot possibly have a negative value unless at least one of the operands is negative. That is, at least one of the non-zero elements in $C_{w7or8j}(i)$ must correspond to a position alleged to be in error by decoder 1 (one of the non-zero positions in the error pattern).

For cyclic PML, a search is performed to find the minimum value of $\alpha_e$. The minimum value must correspond to one of the non-zero positions in the error pattern, so the search need only be through that set. If there are no negative values, the center code word is the output code word regardless of what else is done (MLD or PML). If there are negative values, then the center code word and the altered reliability vector $\alpha_e$ are cyclically shifted (or rotated) until the position of minimum (altered) reliability $\alpha_e$ is in a predetermined position, which in this example is the first position. The set of nearby code words in cyclic PML is a subset of the set of nearby code words in PML. The set of weight 7 or 8 code words in cyclic PML is made up of the weight 7 or 8 code words in PML which have a 1 in the first position. For the Golay code, there are only 253 such code words. Decoding is performed as in PML with the number of difference metrics reduced to 254 (253 nearby code words, and the 1 center code word). The resulting code word is rotated back to its original state upon completion of the vector XOR stage.

The cyclic PML algorithm can be summarized as follows:
1. Perform hard decision decoding (HDD) on the hard decision vector b with a hard decision decoder which decodes to a code word (decoder 1).
2. In the reliability vector $\alpha$ ($\alpha(i)$), complement the sign of the values at the locations where decoder 1 complements bits in the decoding process. Define this new reliability vector as $\alpha_e$ ($\alpha_e(i)$).
3. Find the location of the minimum value in $\alpha_e$ and cyclically shift both the center code word, and $\alpha_e$ until this value is in the first position.
4. Compute the difference metrics for all nearby code words which are expressed as a sum of operands from the set $\alpha_e(i)$.
5. Find the minimum difference metric, and note the corresponding code word. (This code word will be of weight 7 or 8 for the Golay code.)
6. Perform a vector XOR between the center code word, and the code word from part 5. This becomes the rotated output code word.

7. Shift the rotated output code word back to its original position by performing a cyclic shift which is the inverse of the shift in part 3. The resulting code word is the output code word.

The following is an example of the Cyclic PML algorithm performed on the (23, 12) Golay code. Consider the Golay code and assume the all zeros code word is the transmitted code word.
Let $$\alpha = $$

| $\alpha_1$ | $\alpha_2$ | $\alpha_3$ | $\alpha_4$ | $\alpha_5$ | $\alpha_6$ | $\alpha_7$ | $\alpha_8$ | $\alpha_9$ | $\alpha_{10}$ | $\alpha_{11}$ | $\alpha_{12}$ | $\alpha_{13}$ | $\alpha_{14}$ | $\alpha_{15}$ | $\alpha_{16}$ | $\alpha_{17}$ | $\alpha_{18}$ | $\alpha_{19}$ | $\alpha_{20}$ | $\alpha_{21}$ | $\alpha_{22}$ | $\alpha_{23}$ |
|---|---|---|---|---|---|---|---|---|---|---|---|---|---|---|---|---|---|---|---|---|---|---|

Let $$b = $$

| 0 | 0 | 0 | 0 | 0 | 0 | 1 | 1 | 0 | 0 | 0 | 1 | 0 | 0 | 0 | 0 | 0 | 0 | 1 | 0 | 0 | 0 | 0 |
|---|---|---|---|---|---|---|---|---|---|---|---|---|---|---|---|---|---|---|---|---|---|---|

Therefore, the received hard decision vector b has 4 errors at locations 7, 8, 12 and 19.
Let the associated syndrome and error pattern of b yield $$EP = $$

| 0 | 0 | 0 | 1 | 0 | 0 | 0 | 0 | 1 | 0 | 0 | 0 | 0 | 0 | 0 | 0 | 1 | 0 | 0 | 0 | 0 | 0 | 0 |
|---|---|---|---|---|---|---|---|---|---|---|---|---|---|---|---|---|---|---|---|---|---|---|

Decoder 1 alleges errors at locations 4, 9 and 17. The center code word and $\alpha_e$ are given by;

Center Code word =

| 0 | 0 | 0 | 1 | 0 | 0 | 1 | 1 | 1 | 0 | 0 | 1 | 0 | 0 | 0 | 0 | 1 | 0 | 1 | 0 | 0 | 0 | 0 |
|---|---|---|---|---|---|---|---|---|---|---|---|---|---|---|---|---|---|---|---|---|---|---|

$$\alpha_e = $$

| $\alpha_1$ | $\alpha_2$ | $\alpha_3$ | $-\alpha_4$ | $\alpha_5$ | $\alpha_6$ | $\alpha_7$ | $\alpha_8$ | $-\alpha_9$ | $\alpha_{10}$ | $\alpha_{11}$ | $\alpha_{12}$ | $\alpha_{13}$ | $\alpha_{14}$ | $\alpha_{15}$ | $\alpha_{16}$ | $-\alpha_{17}$ | $\alpha_{18}$ | $\alpha_{19}$ | $\alpha_{20}$ | $\alpha_{21}$ | $\alpha_{22}$ | $\alpha_{23}$ |
|---|---|---|---|---|---|---|---|---|---|---|---|---|---|---|---|---|---|---|---|---|---|---|

Cyclic PML finds the minimum value of $\alpha_e$ and proceeds as if this position is in error in the Center Code word. (This must come from position 4, 9 or 17.)

This position is rotated to the first position.

Let the minimum value of $\alpha_e$ occur in position 9. Cyclically rotate the Center Code word and $\alpha_e$ until position 9 is in the first position.

Center Code word (rotated) =

| 1 | 0 | 0 | 1 | 0 | 0 | 0 | 0 | 1 | 0 | 1 | 0 | 0 | 0 | 0 | 0 | 0 | 0 | 0 | 1 | 0 | 0 | 1 | 1 |
|---|---|---|---|---|---|---|---|---|---|---|---|---|---|---|---|---|---|---|---|---|---|---|---|

$\alpha_e$ (rotated) =

| $-\alpha_9$ | $\alpha_{10}$ | $\alpha_{11}$ | $\alpha_{12}$ | $\alpha_{13}$ | $\alpha_{14}$ | $\alpha_{15}$ | $\alpha_{16}$ | $-\alpha_{17}$ | $\alpha_{18}$ | $\alpha_{19}$ | $\alpha_{20}$ | $\alpha_{21}$ | $\alpha_{22}$ | $\alpha_{23}$ | $\alpha_1$ | $\alpha_2$ | $\alpha_3$ | $-\alpha_4$ | $\alpha_5$ | $\alpha_6$ | $\alpha_7$ | $\alpha_8$ |
|---|---|---|---|---|---|---|---|---|---|---|---|---|---|---|---|---|---|---|---|---|---|---|

Cyclic PML calculates the 254 difference metrics (DM) for all code words of Hamming weight 7 or 8 which also have a 1 in the first position.

In this example the minimum DM should correspond to the center code word (rotated) itself.

This code word XOR the center code word yields the all zeros code word.

An inverse rotation needs to be performed to return the corrected code word to its original alignment.

This is the output code word.

Figure 4:
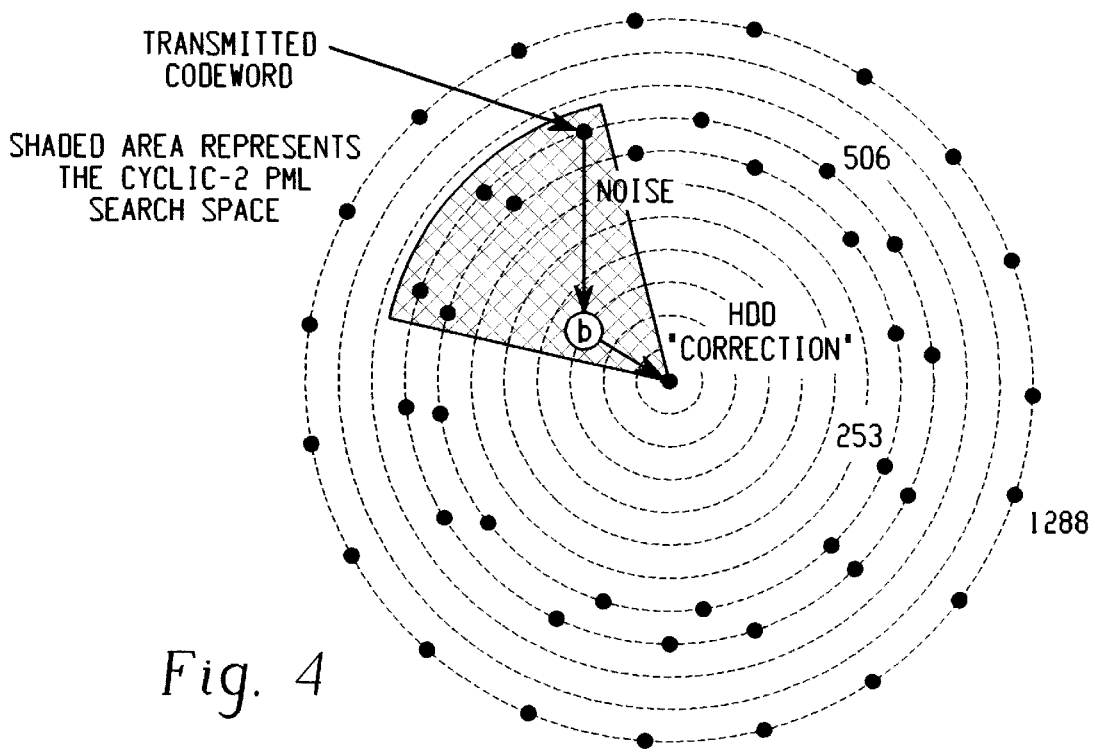
FIG. 4 illustrates in a graphical manner nearby codeword distribution and search space reduction using two position search with a cyclic code.

Since cyclic PML performs very nearly as well as PML which in turn performs very nearly as well as true maximum likelihood decoding MLD, one might consider reducing the search space even further. This is depicted in FIG. 4.

Cyclic-1 PML is accomplished via a rotation of the center code word and altered reliability vector $\alpha_e$ until the position of interest (minimum $\alpha_e(i)$) is in the first position, thereby simplifying the difference metric calculation. Consider a "two-position search" variant of PML referred to herein as Cyclic-2 PML. Unlike the one position search algorithm, there is no simple "trick" to force the second minimum value into a common position. A search is performed on $\alpha_e(i)$ to find the first minimum. The center code word and the vector of reliability data $\alpha$ are rotated to move this position to the first position as in cyclic-1 PML. A second search is performed on the rotated $\alpha 1e(i)$ to find the second minimum. The second minimum can be in any one of the n-1 remaining positions. For each of the n-1 positions a separate set of nearby code words is considered. When the algorithm is performed via a computer program, this amounts to a different subroutine for each of the n-1 possible locations of the second minimum. The memory requirements increase considerably. However, the number of operations which need to be performed to decode any one received vector is further reduced. For the Golay code, given 2 positions, the set of weight 7 or 8 code words which needs to be considered is only of size 77.

Another approach is to eliminate from each difference metric the two reliability values corresponding to the positions of the two minimum values of $\alpha_e(i)$, and redefining the difference metric of the center code word to be minus the sum of these two values ($\alpha_e(1)$ and $\alpha_e$ (second minimum position), after rotation). This saves roughly 77×2 or 154 additions with respect to directly computing the difference metrics DM.

Quasi-cyclic codes, for example, an extended Hamming code, can be accommodated by performing the two searches first. After the first and second minimums are found, rotate the cyclic portion for the (at least one—both minimum bit locations could be in the cyclic portion) bit in the cyclic part of the code.

The cyclic-2 PML algorithm for any cyclic linear block code can be summarized as follows:

1. Perform hard decision decoding (HDD) on the hard decision vector with a hard decision decoder which decodes to a code word (decoder 1).

2. In the reliability vector $\alpha_e$ complement the sign of the values at the locations where the hard decision decoder complements bits in the decoding process. Define this new reliability vector as $\alpha_e$.

3. Find the location of the minimum value of $\alpha_e(i)$, and cyclically shift both the center code word, and reliability vector $\alpha_e$ ($\alpha_e(i)$) until this value is in the first position.

4. Find the location of the second minimum value of $\alpha_e(i)$, and note this location.

5. Compute the difference metrics for all nearby code words which are expressed as a sum of operands from the set $\alpha_e(i)$. Typically each difference metric will require 2t additions to compute. The nearby code words in this set is a subset of the nearby code words in cyclic-1 PML. The nearby code words is this set have a 1 in the first location, and a 1 in the location from part 4.

6. Find the minimum difference metric, and note the corresponding code word.

7. Perform a vector XOR between the (rotated) center code word, and the code word from part 6. This becomes the rotated output code word.

8. Shift the rotated output code word back to its original position by performing a cyclic shift which is the inverse of the shift in part 3. The resulting code word is the output code word.

The following is an example of the Cyclic-2 PML algorithm performed on the (23, 12) Golay code. Consider the Golay code and assume the all zeros code word is the transmitted code word.

Let $\alpha =$

| $\alpha_1$ | $\alpha_2$ | $\alpha_3$ | $\alpha_4$ | $\alpha_5$ | $\alpha_6$ | $\alpha_7$ | $\alpha_8$ | $\alpha_9$ | $\alpha_{10}$ | $\alpha_{11}$ | $\alpha_{12}$ | $\alpha_{13}$ | $\alpha_{14}$ | $\alpha_{15}$ | $\alpha_{16}$ | $\alpha_{17}$ | $\alpha_{18}$ | $\alpha_{19}$ | $\alpha_{20}$ | $\alpha_{21}$ | $\alpha_{22}$ | $\alpha_{23}$ |
|---|---|---|---|---|---|---|---|---|---|---|---|---|---|---|---|---|---|---|---|---|---|---|

Let b =

| 0 | 0 | 0 | 0 | 0 | 0 | 1 | 1 | 0 | 0 | 0 | 1 | 0 | 0 | 0 | 0 | 0 | 0 | 1 | 0 | 0 | 0 | 0 |

Therefore, the received hard decision vector b has 4 errors at locations 7, 8, 12 and 19.

Let the associated syndrome and error pattern of b yield

EP =

| 0 | 0 | 0 | 1 | 0 | 0 | 0 | 0 | 1 | 0 | 0 | 0 | 0 | 0 | 0 | 0 | 0 | 1 | 0 | 0 | 0 | 0 | 0 |

Decoder 1 alleges errors at locations 4, 9 and 17. The center code word and $\alpha_e$ are given by;

Center Code word =

| 0 | 0 | 0 | 1 | 0 | 0 | 1 | 1 | 1 | 0 | 0 | 1 | 0 | 0 | 0 | 0 | 1 | 0 | 1 | 0 | 0 | 0 | 0 |

$\alpha_e =$

| $\alpha_1$ | $\alpha_2$ | $\alpha_3$ | $-\alpha_4$ | $\alpha_5$ | $\alpha_6$ | $\alpha_7$ | $\alpha_8$ | $-\alpha_9$ | $\alpha_{10}$ | $\alpha_{11}$ | $\alpha_{12}$ | $\alpha_{13}$ | $\alpha_{14}$ | $\alpha_{15}$ | $\alpha_{16}$ | $-\alpha_{17}$ | $\alpha_{18}$ | $\alpha_{19}$ | $\alpha_{20}$ | $\alpha_{21}$ | $\alpha_{22}$ | $\alpha_{23}$ |

Cyclic PML finds the minimum value of $\alpha_e$ and proceeds as if this position is in error in the Center Code word. (This must come from position 4, 9 or 17.)

This position is rotated to the first position.

Let the minimum value of $\alpha_e$ occur in position 9. Cyclically rotate the Center Code word and $\alpha_e$ until position 9 is in the first position.

Center Code word (rotated) =

| 1 | 0 | 0 | 1 | 0 | 0 | 0 | 0 | 1 | 0 | 1 | 0 | 0 | 0 | 0 | 0 | 0 | 0 | 1 | 0 | 0 | 1 | 1 |

$\alpha_e$ (rotated) =

| $-\alpha_9$ | $\alpha_{10}$ | $\alpha_{11}$ | $\alpha_{12}$ | $\alpha_{13}$ | $\alpha_{14}$ | $\alpha_{15}$ | $\alpha_{16}$ | $-\alpha_{17}$ | $\alpha_{18}$ | $\alpha_{19}$ | $\alpha_{20}$ | $\alpha_{21}$ | $\alpha_{22}$ | $\alpha_{23}$ | $\alpha_1$ | $\alpha_2$ | $\alpha_3$ | $-\alpha_4$ | $\alpha_5$ | $\alpha_6$ | $\alpha_7$ | $\alpha_8$ |

Cyclic-2 PML finds the second minimum value of $\alpha_e$ (rotated) and proceeds as if this position is also in error in the Center Code word.

In general, this position can come from any of the remaining positions 2–23. In this example, the Hamming weight of the error pattern is >1, so the second minimum must also come from one of the positions alleged to be in error by decoder 1. That is $\alpha_{17}$ or $\alpha_4$ which (after rotation) are in locations 9 and 19 respectively.

Let the second minimum occur in position (after rotation) 19.

Cyclic-2 PML calculates the 77 difference metrics (DM) for all code words of Hamming weight 7 or 8 which have a 1 in the 1st position, and a 1 in the 9th position.

In this example the minimum DM should correspond to the Center Code word (rotated) itself.

This code word XOR the Center Code word yields the all zeros code word.

An inverse rotation needs to be performed to return the corrected code word to its original alignment, to produce the output code word.

Note that the 77 difference metrics are different for each of the 22 possible locations of the second minimum. Fewer difference metrics need to be computed to decode a given code word.

Stated generally, the search space reduction process involving Cyclic-1 and Cyclic-2 can be extended to other codes with minimum distances greater than four. In such a code, identify the set of nearby code words that differ from the center code word in $d_{min}+1$ positions or less. The number of searches through $\alpha_e$ for the minimum values is then defined by $\lfloor d_{min}/2 \rfloor$.

In accordance with the present invention, in addition to soft decision decoding, an iterative decoding process for a product code requires that each decode process provide not only an output bit, but a measure of the reliability of that bit. More precisely, this is a measure of the likelihood that each decoded bit is correct as computed by the magnitude of the log likelihood ratio. Thus, for decoding a block code via soft information, the likelihood that the output code word contains a logical 1 in the mth position is given by $$\Lambda_1(m) = \ln\left[\frac{\sum_{j=1,CW_j(m)=+1}^{2^{k-1}} Pr(CW_j|r)}{\sum_{j=1,CW_j(m)=-1}^{2^{k-1}} Pr(CW_j|r)}\right] \quad (6)$$

where $Pr(CW|r)$ is the probability that the jth code word was transmitted given the received vector r. The numerator is the sum of the probabilities of all the $2^{k-1}$ code words which have a +1 (or a logical 1) in the $m^{th}$ position, while the denominator is the sum of the probabilities of all $2^{k-1}$ code words which have a −1 (or a logical 0) in the $m^{th}$ position. Each probability is an exponential function of the distance between each code word, and the received vector r. That is, $$PR(CW_j|r) = \frac{1}{\sqrt{2\pi}\,\sigma} e^{-[\sum_{i=1}^n (CWC_i - r(i))^2]/2\sigma^2} \quad (7)$$

where $\sigma^2$ is the variance of the noise and $CW(i)$ is the ith element in the jth code word in (+1, −1) notation. It is extremely difficult to evaluate the likelihood ratio via this definition directly in real time. However, due to the exponential nature of the probabilities and the distance structure of the code, usually one term dominates in the numerator and one term dominates in the denominator. This property can be exploited to obtain an estimate of the log likelihood ratio for each term.

When considering only the one dominant term in both the numerator and denominator, the log likelihood ratio can be approximated by $$\frac{1}{\sigma^2}\left[\sum_{i=1}^n CW_1(i)r(i) - \sum_{i=1}^n CW_0(i)r(i)\right] \quad (8)$$

where $CW_1(i)$ is the $i^{th}$ element in the numerator code word which corresponds to a logical 1 in the $m^{th}$ position (in (+1, −1) notation) and $CW_0(i)$ is the $i^{th}$ element in the denominator code word which corresponds to a logical 0 in the $m^{th}$ position (again, in (+1, −1) notation).

Therefore, in accordance with the invention, a reasonable estimate of the soft value for each output bit is the difference in correlation values between the dominant code word with a 1 in the $m^{th}$ position and the dominant code word with a 0 in the $m^{th}$ position. For finding these dominant code words, this is where certain properties of the Cyclic-2 PML algorithm are exploited. Consider the following observations about the Cyclic-2 PML algorithm when applied to extended Hamming codes with particular attention given to the (64, 57) extended Hamming code.

The Cyclic-2 PML algorithm generates a center code word and a small set of nearby code words which consists of only (n-2)/2 code words (31 for the (64, 57) example code).

Since $d_{min}=4$ for the extended Hamming codes, each code word in the set of nearby code words differs from the center code word in four locations. Also, the difference pattern is itself a code word.

After rotation in the Cyclic-2 PML decoding process, two of these four locations are common to all nearby code words.

Each of the remaining n-2 positions (62 for the (64, 57) example code) is different from the center code word in exactly one of the nearby code words (31 for the (64, 57) example code). Thus, each of the nearby code words has 2 positions that are different from the center code word.

The difference metric (DM) calculated for each nearby code word is related to the difference between a reference value, and the correlation value of that code word. That is, $$DM_j = REF - \sum_{i=1}^n CW_j(i)r(i) \quad (9)$$

Since the reference values will cancel, replace the log likelihood ratio estimate by $$\Lambda(m) \approx \frac{1}{\sigma^2}\left[\sum_{i=1}^n CW_1(i)r(i) - \sum_{i=1}^n CW_0(i)r(i)\right] \Rightarrow DM_0 - DM_1 \quad (9)$$

which is proportional to the log likelihood ratio estimate. Since these values are being compared among themselves, omit the constant of proportionality $(1/\sigma^2)$.

These observed properties of the cyclic-2 PML algorithm are the key to determining the soft output value based on the difference in correlation values between the dominate code word with a 1 in the mth position and the dominant code word with a 0 in the mth position. Also, one would like to output hard decision data and reliability information so the next decoding will have the data in an appropriate format.

The search for the dominant code words for the log likelihood ratio approximation will be confined to the center code word and the set of nearby code words. The cyclic-2 PML algorithm will yield an output code word, so one will want to produce the confidence measure for each bit in the output code word. This confidence value is the absolute value of the log likelihood ratio estimate. The output code word is the code word which has the highest correlation, or the smallest difference metric DM. Taking the difference between the DMs for each code word in the set of nearby code words (and center code word) and the DM of the output code word, will yield the confidence of each bit in the output code word. This is the desired information. Since the cyclic-2 PML algorithm determines the output code word while rotated, the reliability values are generated while rotated also. All nearby code words are similar to the center code word except in four positions. Two of the four positions are the first position and the jth position (locations of first and second minimum respectively). The other two positions are unique to each nearby code word. The DM of the center code word is defined to be 0, however, the computations can be facilitated by changing this to $[\alpha(1)+\alpha(j)]$. These terms are common to all nearby code words, so by accounting for them in the center code word DM, they can be eliminated from the DM calculation of each nearby code word.

Given that the center code word is the output code word, the reliability value for each bit (the magnitude of the log likelihood ratio approximation) is the DM value for the code word which differs from the center code word at the location of the bit, minus the DM for the center code word. The reliability for the first and jth bit positions is the minimum of all DM for each nearby code word.

If the output code word is one of the nearby code words, then the reliability value for each bit is the difference in DM values for the code word which differs from the center code word at the location of the bit, and the DM of the output code word. The reliability for the first and jth bit positions is the difference in DM values between the center code word, the output code word. The reliability of the two bits unique to the output code word is the difference between the DM values between the output code word, and that nearby code word (or the center code word) which had the second smallest value.

The SISO cyclic-2 PML algorithm for the (64, 57) extended Hamming code is summarized as follows:

1) Perform hard decision decoding (with a decoder that decodes to a code word) on a copy of the hard decision vector. Call this result the center code word.

2) In the reliability vector, complement the sign of the values at the locations where the hard decision decoder complements bits. Define this new reliability vector as $\alpha_e$.

3) Find the location of the minimum value of $\alpha_e(i)$, and cyclically shift both the center code word, and reliability vector $\alpha_e$ until this value is in the first position.

4) Find the location of the second minimum value of $\alpha_e(i)$, and note this location.

5) Compute the DMs for all (31) nearby code words which are expressed as a sum of operands from the set $\alpha_e(i)$. All nearby code words differ from the center code word in both the 1st position and the position from step 4 (along with 2 other positions unique to that code word). Since these two position can be accounted for in the DM of the center code word, they are not needed for the DM calculation of the nearby code words. Consequently, each nearby code word's DM is computed with the addition of only two values from $\alpha_e$. Next, replace the two values in $\alpha_e$ used to compute each DM with the value of the DM itself. The values of $\alpha_e(1)$ and $\alpha_e$(2nd minimum) are both replaced with the negative sum $-[\alpha_e(1)+\alpha_e(2\text{nd minimum})]$.

6) Find the minimum DM among the (31) nearby code words and the center code word, and note the corresponding weight 4 (or weight zero) code word. Also note the two positions which were used to compute the DM.

7) Find the second minimum DM.

8) Perform a vector XOR between the (rotated) center code word, and the code word of minimum DM from part 6. This becomes the rotated output code word.

9) Subtract the minimum difference metric from each value in $\alpha_e$ (which were replaced with DMs.)

10) The two positions of $\alpha_e$ from part 6 are replaced with the difference between the second minimum DM, and the minimum DM (both from part 6). 11) Shift the rotated output code word and reliability vectors back to their original positions by performing a cyclic shift which is the inverse of the sift in part 3. The resulting code word is the output code word, and the resulting reliability vector $\alpha_e$ is the output reliability vector $\alpha$.

Example Code Simulation Results

Figure 5:
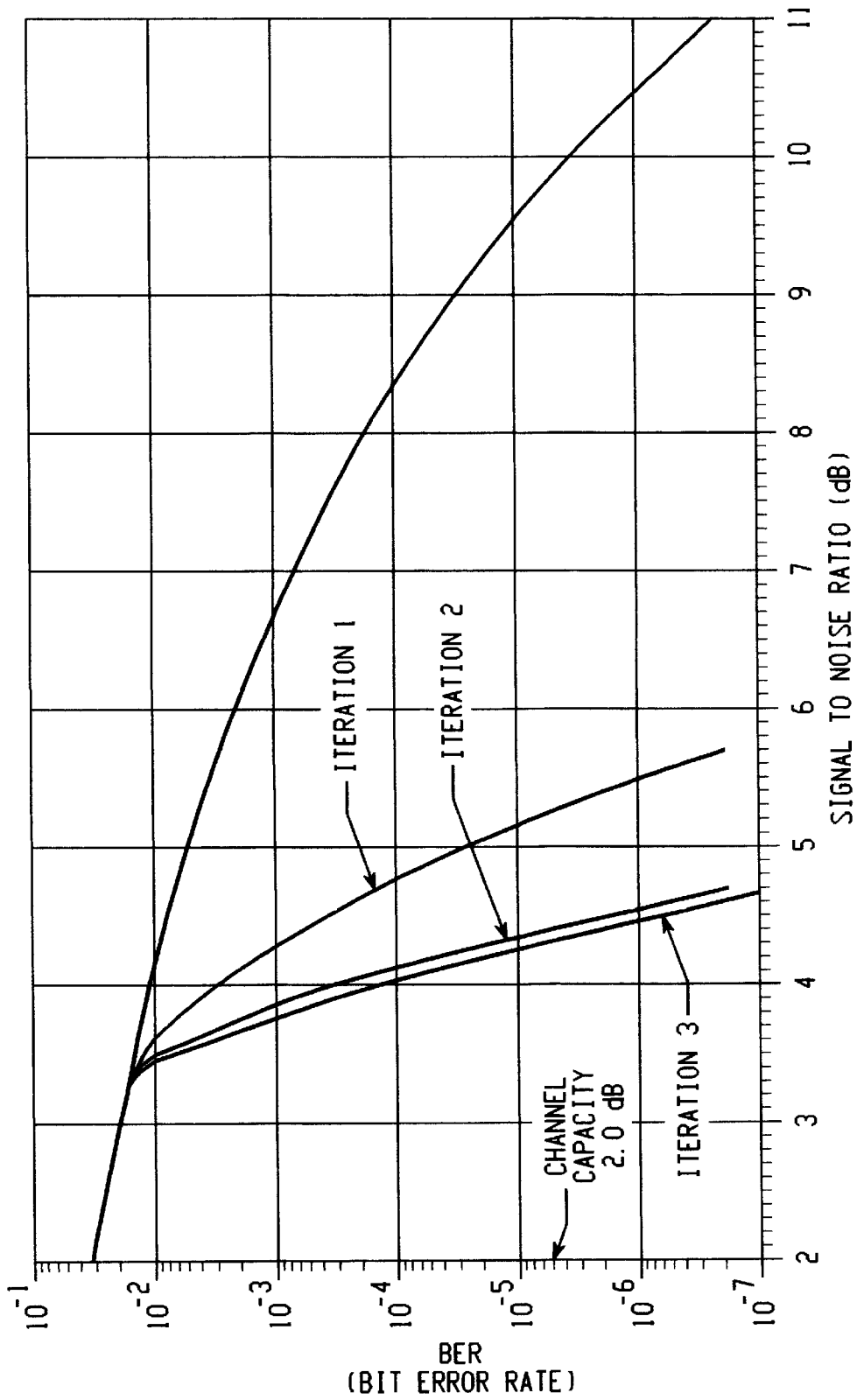
FIG. 5 graphically illustrates bit error rates (BER) for iterative decoding using the invention, at different signal to noise ratios.

The example code is a product code built from the (64, 57) extended Hamming code. This code consists of 64 blocks resulting in a (4096, 3249) code. Define one iteration as the decoding of 64 blocks horizontally, followed by decoding 64 blocks vertically. FIG. 5 shows the BER performance curves for this code for the first 3 iterations. All simulations were carried out until a minimum of 1000 bit errors were received. It can be seen that the performance slows after the second iteration. In fact, the increase in performance stops completely after the third iteration with 6.0 dB of coding gain at a BER of $10^{-6}$.

Those skilled in the art will appreciate that the invention can be carried out entirely in software, in dedicated hardware, or a combination of the two. The specific hardware requirements will be determined by the complexity of the block code being used, as well as the particular aspects of the decoding process used. For example, the number of subroutines used to search the nearby code words will determine in part the memory requirements for the system. One approach for carrying out the processes of the present invention would be the use of address translation logic along with a general purpose processor, such as an x86 or Pentium® processor. Alternatively, application specific integrated circuits (ASICs) could be designed to execute the functions identified herein, including address translation logic, vector XOR operations, additions, subtractions and compares.

While the invention has been shown and described with respect to specific embodiments thereof, this is for the purpose of illustration rather than limitation, and other variations and modifications of the specific embodiments herein shown and described will be apparent to those skilled in the art within the intended spirit and scope of the invention as set forth in the appended claims.

I claim:

1. A method for decoding a linear block code of information bits transmitted across a signal channel, comprising the steps of:

a) receiving the transmitted signals from the channel and converting the received signals into a number of received vectors r with each received vector having a length of n; and for each vector r, b) performing hard decisions on r to produce a hard decision data vector b and a corresponding reliability information vector $\alpha$ and performing hard decision decoding on b to produce an error pattern e, and further converting each vector b into a center code word; the vector $\alpha$ and the center code word each having a length n;

c) identifying a set of j=0 to p nearby code words including the center code word;

d) determining, for each nearby code word a difference metric $DM_j$, wherein each difference metric $DM_j$ is defined by the following relationship:

$$DM_j = \Sigma \delta_j(I)\alpha(I) \text{ for } I=0 \text{ to } n$$

where $\delta_j \epsilon(0, 1)$ is the Hamming difference between b and the $j^{th}$ nearby code word;

e) identifying a minimum difference metric $DM_{min}$ and determining an output code word as being that code word which corresponds to $DM_{min}$; and f) assigning a confidence measure for each bit m in the output code word based on a difference of difference metric values for the dominant code word with a "1" in the $m^{th}$ position and the dominant code word with a "0" in the $m^{th}$ position.

2. The method of claim 1 wherein j=0 for the center code word and the difference metric for the center code word is defined by the following relationship:

$DM_0 = \Sigma e(I)\alpha(I)$ for $I=0$ to $n$.

3. The method of claim 1 wherein the dominant code word with a "1" in the $m^{th}$ position is defined as the code word with a minimum difference metric and having a "1" in the $m^{th}$ position from the set of nearby code words, and the dominant code word with a "0" in the $m^{th}$ position is defined as the code word with a minimum difference metric and having a "0" in the $m^{th}$ position from the set of nearby code words.

4. The method of claim 1 wherein the step of identifying the set of nearby code words includes the step of selecting those nearby code words having a predetermined Hamming distance from the center code word.

5. The method of claim 4 comprising the steps of: 1) in the reliability vector $\alpha$ complementing the sign of each position corresponding to each bit of the vector b that was complemented to produce the center code word, to produce a reliability vector $\alpha_e$; 2) locating which position ($\alpha_{x1}$) in $\alpha_e$ has a first minimum value; and 3) shifting the center code word and the vector $\alpha_e$ so said minimum value position is in a predetermined position.

6. The method of claim 5 comprising the step of locating which position ($\alpha_{x2}$) in $\alpha_e$ has a second minimum value; and
restricting the set of nearby code words to a subset of nearby code words having different values in positions x1 and x2 compared to the center code word.

7. The method of claim 1 wherein each said difference of difference metrics calculation used to assign a confidence measure for each $m^{th}$ position in the output code word approximates a log likelihood ratio estimate of a dominant code word with a "1" in the $m^{th}$ position and a dominant code word with a "0" in the $m^{th}$ position.

8. The method of claim 7 wherein each difference metric is related to the correlation between a code word and the vector b.

9. The method of claim 1 wherein the output code word is hard output information and the confidence measure for each bit thereof is used as soft output information.

10. The method of claim 9 wherein said soft output confidence measure and output code word are further input for an iterative decoding process.

11. The method of claim 1 wherein said step of producing an error pattern e is performed by computing a syndrome on the vector b.

12. The method of claim 11 comprising the step of using an absolute value of each element in r to generate $\alpha$.

13. The method of claim 12 comprising the step of converting each vector b into a center code word by performing a vector XOR between e and b.

14. The method of claim 13 comprising the step of replacing each element in the vector $\alpha$ with the negative of that value at those locations where there is a 1 in the vector e.

15. The method of claim 1 wherein the step of identifying a set of nearby code words comprises identifying code words having a Hamming distance of $d_{min+1}$ or less from the center code word.

16. The method of claim 15 wherein for a cyclic code, the set of nearby code words is further reduced by searching through $\alpha_e$ for $d_{min}/2$ minimum value positions.

17. A method for decoding a linear block code to produce soft output information, comprising the steps of:
a) performing hard decisions on a received vector r to produce a hard decision data vector b and a reliability vector $\alpha$, both of length n;
b) decoding the vector b to a legitimate center code word;
c) identifying a set of j nearby code words including the center code word;
d) determining for each nearby code word a difference metric that corresponds to the correlation between said each nearby code word and the vector b;
e) producing an output code word based on a minimum difference metric; and
f) assigning a confidence measure for each bit m in the output code word based on a difference of difference metrics that approximates the likelihood that the $m^{th}$ bit in the output code word is correct.

18. The method of claim 17 wherein a difference metric is related to the correlation of a code word to the vector b.

19. The method of claim 17 wherein each said difference of difference metrics calculation used to assign a confidence measure for each $m^{th}$ (for m=1 to n) position in the output code word approximates a log likelihood ratio estimate of a dominant code word with a "1" in the $m^{th}$ position and the dominant code word with a "0" in the $m^{th}$ position.

20. The method of claim 19 wherein the dominant code word with a "1" in the $m^{th}$ position is defined as the code word with a minimum difference metric and having a "1" in the $m^{th}$ position from the set of nearby code words, and the dominant code word with a "0" in the $m^{th}$ position is defined as the code word with a minimum difference metric and having a "0" in the $m^{th}$ position from the set of nearby code words.

* * * * *

UNITED STATES PATENT AND TRADEMARK OFFICE
CERTIFICATE OF CORRECTION

PATENT NO. : 5,930,272
DATED : July 27, 1999
INVENTOR(S) : WILLIAM H. THESLING

It is certified that error appears in the above-identified patent and that said Letters Patent is hereby corrected as shown below:

In the Abstract, paragraph b), line 3, please delete "a" before the word "and" and insert -- $\alpha$ --.

In the Abstract, paragraph b), line 5, please delete the second instance of "a" and insert -- $\alpha$ --.

In the Abstract, paragraph c), please delete all instances of "$D_{min}$" and insert -- $DM_{min}$" accordingly.

Column 4, line 22, please delete "$\hat{3}$" and insert -- $\hat{e}$ --.

Signed and Sealed this

Twenty-first Day of March, 2000

Attest:

Q. TODD DICKINSON

Attesting Officer

Commissioner of Patents and Trademarks